US008552442B2

(12) United States Patent
Hata et al.

(10) Patent No.: US 8,552,442 B2
(45) Date of Patent: Oct. 8, 2013

(54) SEMICONDUCTOR LIGHT EMITTING DEVICE

(75) Inventors: Yasunori Hata, Kyoto (JP); Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 953 days.

(21) Appl. No.: 12/218,239

(22) Filed: Jul. 11, 2008

(65) Prior Publication Data

US 2009/0039372 A1  Feb. 12, 2009

(30) Foreign Application Priority Data

Jul. 13, 2007 (JP) ................................. 2007-184086
Jul. 13, 2007 (JP) ................................. 2007-184087

(51) Int. Cl.
*H01L 33/00* (2010.01)
(52) U.S. Cl.
USPC .............. 257/98; 257/E33.059; 257/E33.067
(58) Field of Classification Search
USPC .............................. 257/98, E33.059, E33.067
See application file for complete search history.

(56) References Cited

U.S. PATENT DOCUMENTS

| 3,914,786 | A * | 10/1975 | Grossi ............................ 257/98 |
| 6,888,723 | B2 * | 5/2005 | Kamiya et al. ................ 361/715 |
| 2007/0097638 | A1 * | 5/2007 | Tsai ............................... 361/696 |

FOREIGN PATENT DOCUMENTS

JP   2003-188418   7/2003

* cited by examiner

*Primary Examiner* — Hrayr A Sayadian
(74) *Attorney, Agent, or Firm* — Hamre, Schumann, Mueller & Larson, P.C.

(57) ABSTRACT

A semiconductor light emitting device includes a semiconductor light emitting element, a lead electrically connected to the semiconductor light emitting element, and a resin package covering the semiconductor light emitting element and part of the lead. The resin package includes a lens facing the front of the semiconductor light emitting element. The lead includes an elongated mounting portion projecting from the resin package. The mounting portion includes a pair of first projections spaced from each other in the longitudinal direction and a second projection positioned between the first projections. The first projections and the second projection project in opposite directions from each other in the width direction of the mounting portion.

7 Claims, 6 Drawing Sheets

SEMICONDUCTOR LIGHT EMITTING DEVICE

BACKGROUND OF THE INVENTION

1. Field of the Invention

The present invention relates to a surface mount type light emitting device incorporating a semiconductor light emitting element.

2. Description of the Related Art

FIG. 11 shows an example of conventional top view type semiconductor light emitting device (see JP-A-2003-188418). The semiconductor light emitting device X shown in the figure includes leads 91A and 91B, an LED chip 92 and a resin package 93. The LED chip 92 is mounted on the lead 91A. The LED chip 92 is connected to the lead 91B via a wire. The resin package 93 covers the LED chip 92 and part of each lead 91A, 91B. The resin package 93 is formed with a lens 93a. The portions of the leads 91A and 91B which project from the resin package 93 are utilized as connection terminals 91Aa and 91Ba. The semiconductor light emitting device X is soldered to a substrate B. Specifically, the connection terminals 91Aa and 91Ba are inserted into through-holes formed in the substrate B, and the portions of the terminals which project from the through-holes are fixed to the substrate B with solder S.

In recent years, to mount various kinds of electronic components on a circuit board, surface mounting using e.g. a reflow furnace is widely performed. With this technique, many electronic components can be collectively mounted. Thus, there is an increasing demand for a semiconductor light emitting device which can be surface-mounted unlike the above-described semiconductor light emitting device X.

SUMMARY OF THE INVENTION

The present invention has been proposed under the circumstances described above. It is, therefore, an object of the present invention to provide a semiconductor light emitting device which can be surface-mounted.

According to a first aspect of the present invention, there is provided a semiconductor light emitting device comprising a semiconductor light emitting element, a lead electrically connected to the semiconductor light emitting element, and a resin package covering the semiconductor light emitting element and part of the lead and including a lens facing the front of the semiconductor light emitting element. The lead includes an elongated mounting portion projecting from the resin package. The mounting portion includes a pair of first projections spaced from each other in the longitudinal direction and a second projection positioned between the first projections. The first projections and the second projection project in opposite directions from each other in the width direction of the mounting portion.

Preferably, the mounting portion extends in either one of a first direction which is parallel to the optical axis of the lens and a second direction which is perpendicular to the first direction. The lead includes an additional mounting portion extending in the other one of the first direction and the second direction.

According to a second aspect of the present invention, there is provided a semiconductor light emitting device comprising a semiconductor light emitting element, a first and a second leads electrically connected to the semiconductor light emitting element, and a resin package covering the semiconductor light emitting element and part of each of the leads and including a lens facing the front of the semiconductor light emitting element. Each of the first and the second leads includes a mounting portion projecting from the resin package and elongated in a direction perpendicular to the optical axis direction of the lens. The mounting portion of the first lead and the mounting portion of the second lead extend parallel to each other. The position at which the first lead projects from the resin package and the position at which the second lead projects from the resin package are opposite from each other in the direction in which the mounting portions extend.

Preferably, the semiconductor light emitting device provided according to the second aspect further comprises a standing portion extending from each of the mounting portions in the optical axis direction of the lens.

Other features and advantages of the present invention will become more apparent from the detailed description given below with reference to the accompanying drawings.

DETAILED DESCRIPTION OF THE PREFERRED EMBODIMENT

Preferred embodiments of the present invention will be described below with reference to the accompanying drawings.

FIGS. 1-5 show a semiconductor light emitting device according to a first embodiment of the present invention. The illustrated semiconductor light emitting device A1 includes leads 1A and 1B, an LED chip 2 and a resin package 3 and is designed as a shell type LED lamp.

Figure 1:
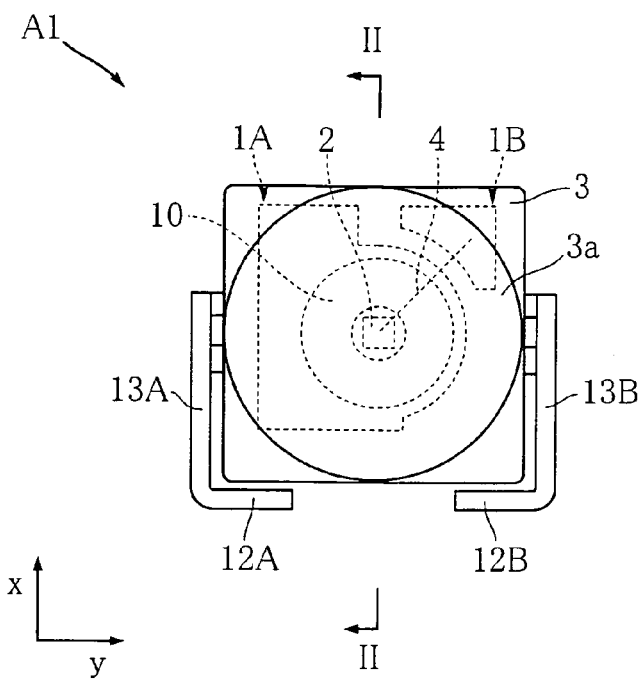
FIG. 1 is a front view showing a semiconductor light emitting device according to a first embodiment of the present invention.
Figure 2:
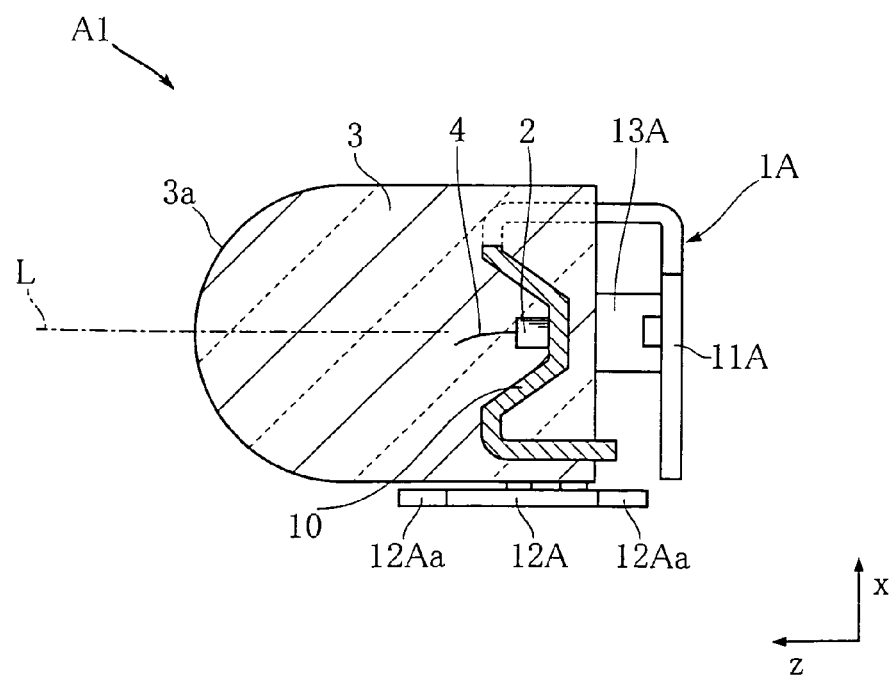
FIG. 2 is a sectional view taken along lines II-II in FIG. 1.
Figure 3:
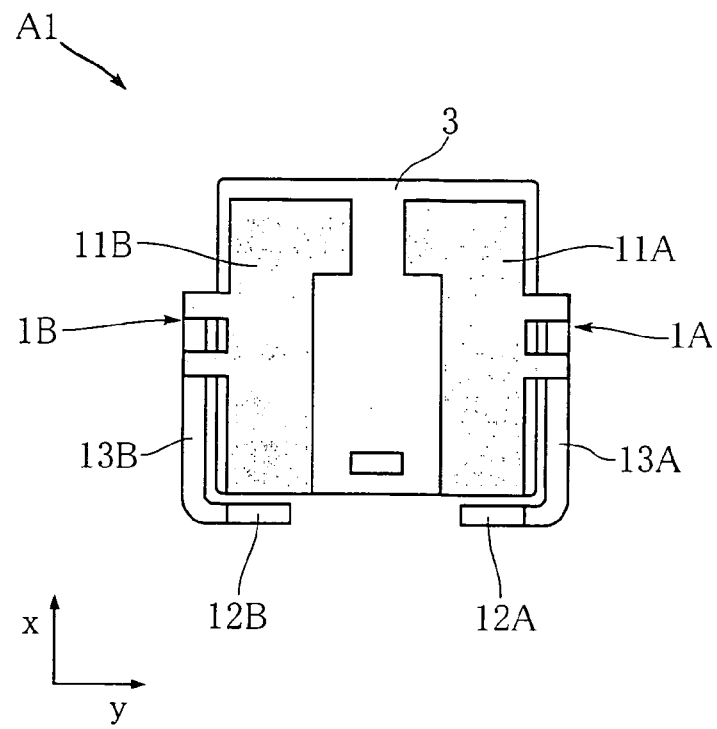
FIG. 3 is a rear view of the semiconductor light emitting device shown in FIG. 1.

The leads 1A and 1B are utilized for mounting the light emitting device A1 to a circuit board and supplying power to the LED chip 2 and made of e.g. Cu alloy. Each of the leads 1A and 1B is partially covered by the resin package 3. As shown in FIGS. 1 and 2, the lead 1A is formed with a bonding cup 10. The bonding cup 10 is in the form of a cone having a bottom surface, and the LED chip 2 is mounted on the bottom surface.

The portion of the lead 1A which projects from the resin package 3 provides mounting portions 11A, 12A and a connecting portion 13A. Similarly, the portion of the lead 1B which projects from the resin package 3 provides mounting portions 11B, 12B and a connecting portion 13B. The mounting portions 11A and 11B are strip portions extending parallel to each other in the direction x (see FIG. 3). The mounting portions 12A and 12B are strip portions extending parallel to each other in the direction z (see FIG. 4). As shown in FIG. 5, the connecting portion 13A is a hook-shaped portion connecting the mounting portions 11A and 12A to each other. Part of the connecting portion 13A extends in the direction x, while the remaining part extends in the direction z. Similarly, the connecting portion 13B is a hook-shaped portion connecting the mounting portions 11B and 12B to each other. Part of the connecting portion 13B extends in the direction x, while the remaining part extends in the direction z.

Figure 4:
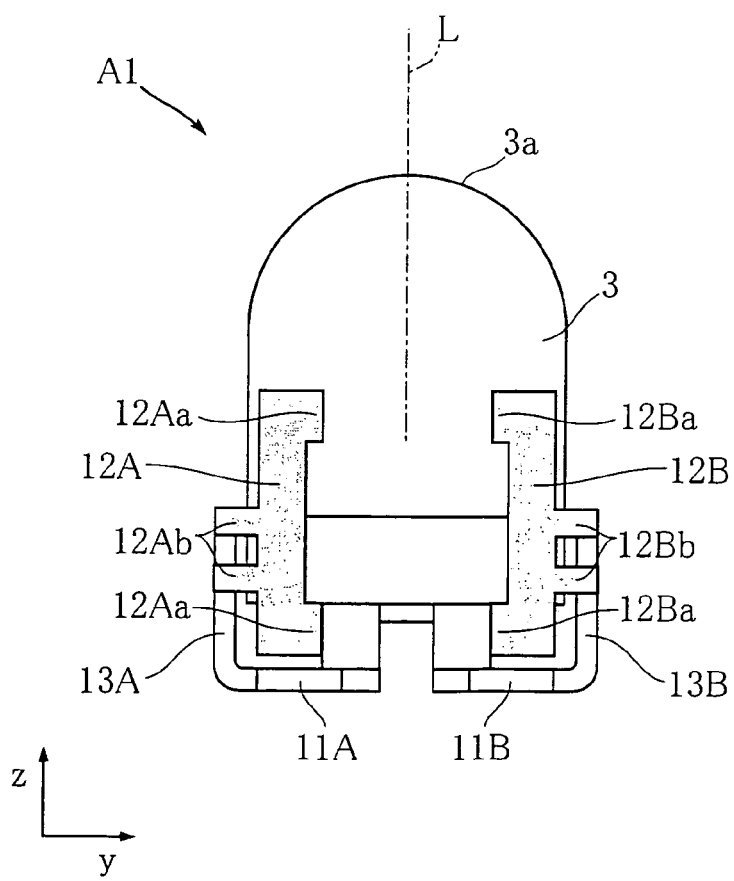
FIG. 4 is a bottom view of the semiconductor light emitting device shown in FIG. 1.
Figure 5:
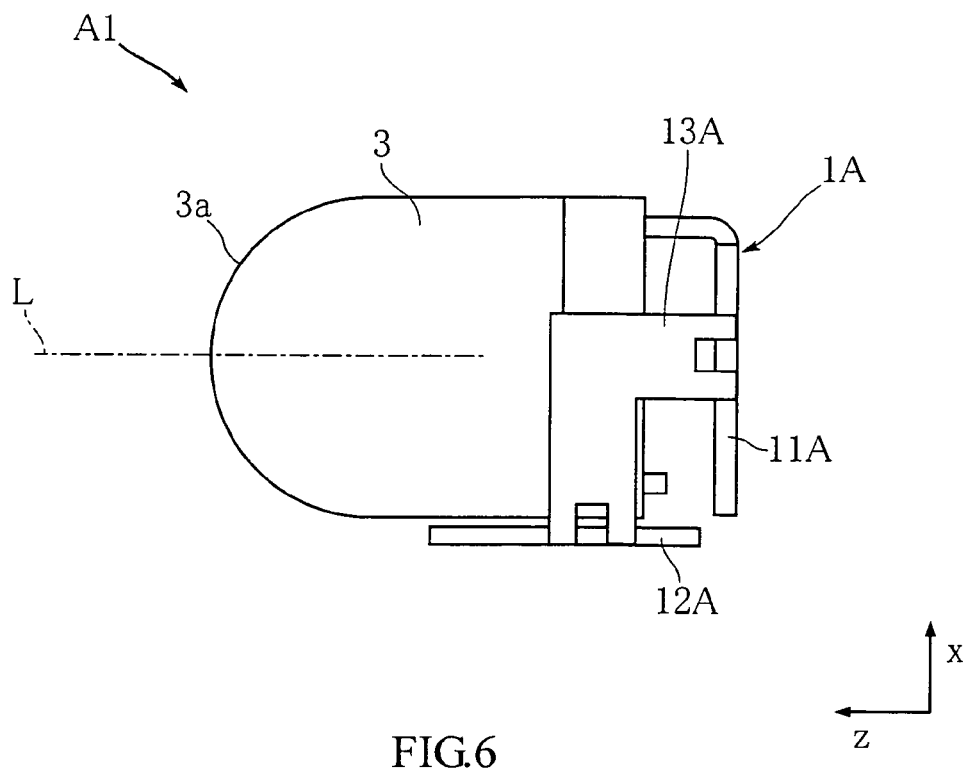
FIG. 5 is a side view of the semiconductor light emitting device shown in FIG. 1.

As shown in FIG. 4, the mounting portion 12A includes a pair of projections 12Aa provided at the ends and a pair of projections 12Ab provided adjacent to the center. In the figure, the paired projections 12Aa are spaced from each other in the direction z (i.e., the longitudinal direction of the mounting portion 12A), and each of the projections 12Aa projects inward (toward the mounting portion 12B) in the direction y (i.e., the width direction of the mounting portion 12A). The other pair of projections 12Ab is positioned between the paired projections 12Aa in the direction z, and each of the projections 12Ab projects outward (away from the mounting portion 12B) in the direction y. Similarly, the mounting portion 12B includes a pair of projections 12Ba provided at the ends and a pair of projections 12Bb provided adjacent to the center. The paired projections 12Ba are spaced from each other in the direction z, and each of the projections 12Ba projects inward (toward the mounting portion 12A) in the direction y. The other pair of projections 12Bb is positioned between the paired projections 12Ba in the direction z, and each of the projections 12Bb projects outward (away from the mounting portion 12A) in the direction y. In the illustrated example, each of the projections 12Ab is a relatively narrow strip extending in the direction y and connected to the connecting portion 13A. Similarly, each of the projections 12Bb is a relatively narrow strip extending in the direction y and connected to the connecting portion 13B.

The LED chip 2 is the light source of the light emitting device A1 and designed to emit light of a predetermined wavelength. The LED chip 2 is bonded to the bottom surface of the bonding cup 10. The upper surface of the LED chip 2 is electrically connected to the lead 1B via a wire 4. The light emitted from the LED chip 2 in the direction x or y is reflected by the side surface of the bonding cup 10 to travel in the direction z.

The resin package 3 covers the LED chip 2 and part of each lead 1A, 1B and is made of a resin (e.g. epoxy resin or silicone resin) which transmits the light emitted from the LED chip 2. The resin package 3 is formed with a lens 3a. The lens 3a is positioned to face the LED chip 2 and has an optical axis L extending in the direction z. The lens 3a has a function to converge the light emitted from the LED chip 2.

The advantages of the semiconductor light emitting device A1 will be described below.

Due to the above-described structure, the light emitting device A1 can be mounted on a circuit board in two different manners. Firstly, when the light emitting device is mounted by using the mounting portions 11A and 11B, the light emitting device A1 is used as a top view type light source which emits light in the direction of the normal to the circuit board. Secondly, when the light emitting device is mounted by using the mounting portions 12A and 12B, the light emitting device A1 is used as a side view type light source which emits light in the direction parallel to the surface of the circuit board.

In surface-mounting the light emitting device A1, centering effect is exhibited due to the surface tension of the molten solder. Specifically, in mounting the light emitting device by using the mounting portions 12A and 12B, molten solder remains between the projections 12Aa, 12Ab, 12Ba, 12Bb and the circuit board. The molten solder acts to pull the object in contact with itself toward the center due to the surface tension. With respect to the mounting portion 12A, this centering effect is produced at the projections 12Aa and 12Ab. The centering effect is produced similarly with respect to the mounting portion 12B. Thus, the centering effect is exerted on each of the mounting portions 12A and 12B with a good balance, whereby the light emitting device A1 is properly positioned relative to the circuit board. Particularly, when the mounting portions 12A and 12B are used for the mounting, the lens 3a overhangs largely from the mounting portions 12A and 12B, so that the light emitting device A1 is in a relatively unstable posture. In such a situation, the centering effect exerting on the mounting portions 12A and 12B is suitable for preventing the light emitting device A1 from deviating from its proper position.

Figure 6:
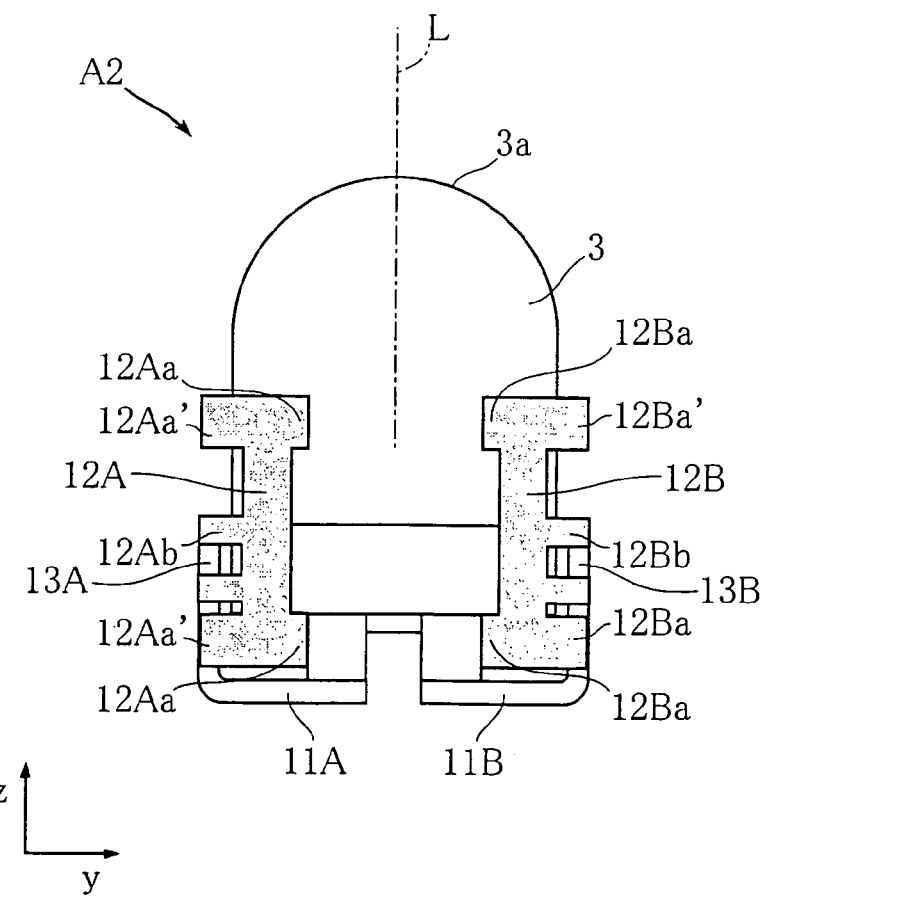
FIG. 6 is a bottom view showing a semiconductor light emitting device according to a second embodiment of the present invention.

FIG. 6 shows a semiconductor light emitting device A2 according to a second embodiment of the present invention. In this figure, the elements which are identical or similar to those of the first embodiment are designated by the same reference signs as those used for the first embodiment. The light emitting device A2 differs from the first embodiment (see FIG. 4) in shape of the mounting portions 12A and 12B. Specifically, the mounting portion 12A, 12B of the second embodiment further includes a pair of projections 12Aa', 12Ba'. The additional projections 12Aa' are substantially the same as the projections 12Aa in position in the direction z and project toward the opposite side of the projections 12Aa in the direction y. Similarly, the additional projections 12Ba' are substantially the same as the projections 12Ba in position in the direction z and project toward the opposite side of the projections 12Ba in the direction y. With this arrangement, the additional projections of the mounting portions 12A and 12B also exhibit the centering effect. As a result, the positional deviation of the light emitting device A2 is prevented more effectively.

According to the present invention, the above-described projections may be provided at the mounting portions 11A and 11B. In this case, the positional deviation of the light emitting device is prevented also when the light emitting device A1 or A2 is used as a top view type light source.

FIGS. 7-10 show a semiconductor light emitting device A3 according to a third embodiment of the present invention. The light emitting device A3 includes leads 1A and 1B, an LED chip 2 and a resin package 3.

Figure 7:
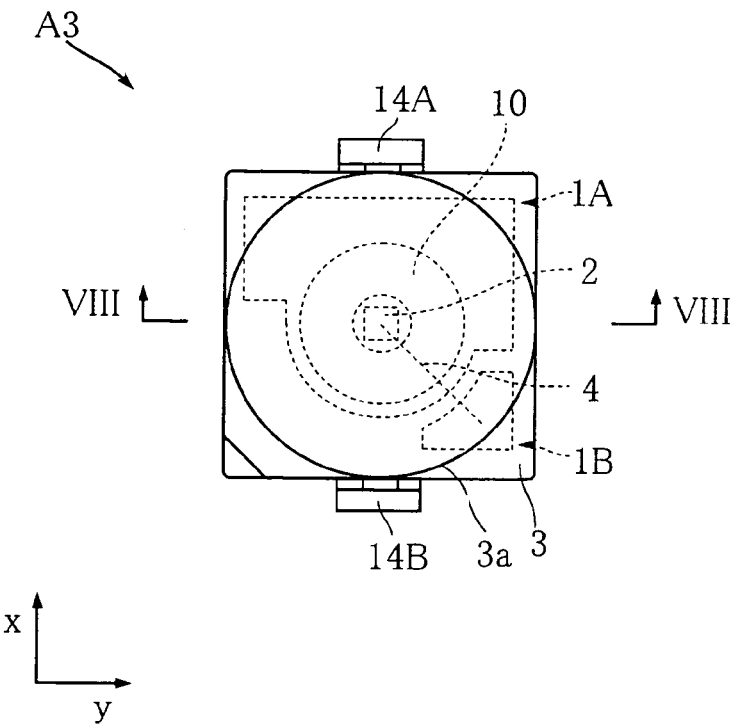
FIG. 7 is a plan view showing a semiconductor light emitting device according to a third embodiment of the present invention.
Figure 8:
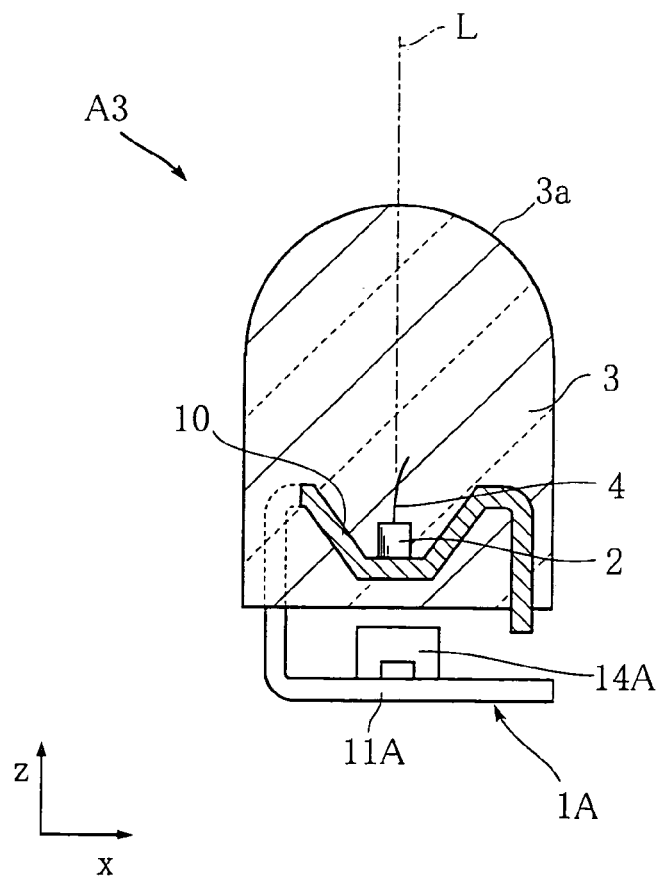
FIG. 8 is a sectional view taken along lines VIII-VIII in FIG. 7.

The leads 1A and 1B are utilized for mounting the light emitting device A3 to a circuit board and supplying power to the LED chip 2 and made of e.g. Cu alloy. Each of the leads 1A and 1B is partially covered by the resin package 3. As shown in FIGS. 7 and 8, the lead 1A is formed with a bonding cup 10. The bonding cup 10 is in the form of a cone having a bottom surface, and the LED chip 2 is mounted on the bottom surface.

Figure 9:
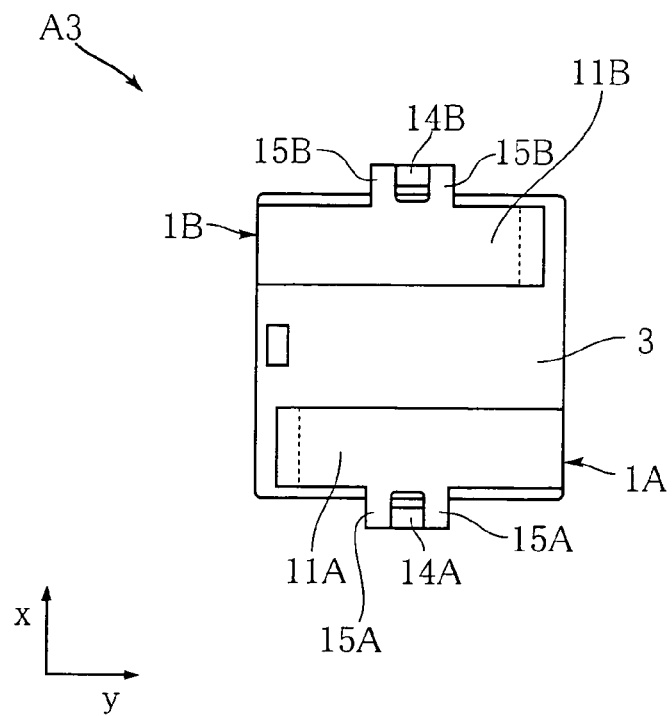
FIG. 9 is a bottom view of the semiconductor light emitting device shown in FIG. 7.
Figure 10:
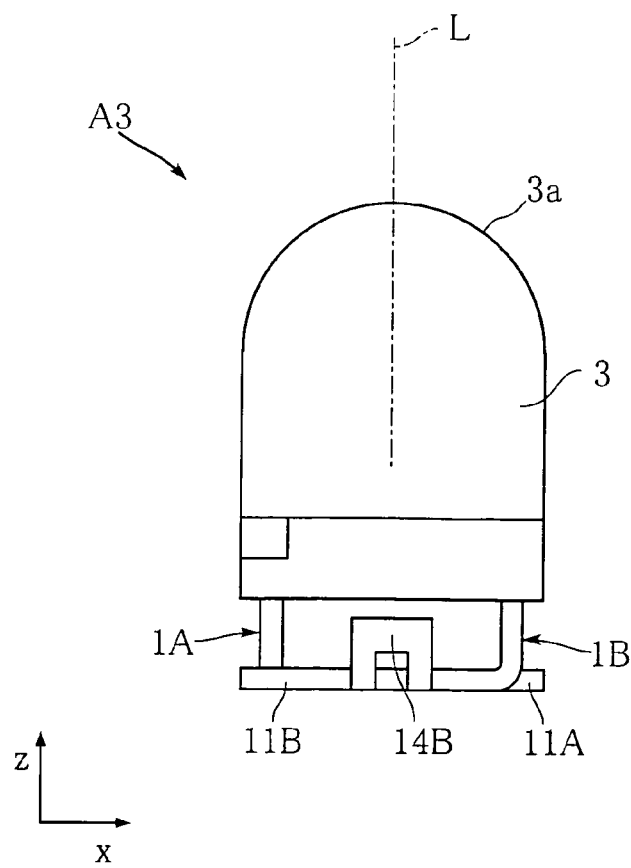
FIG. 10 is a front view of the semiconductor light emitting device shown in FIG. 7.

The portions of the leads 1A and 1B which project from the resin package 3 provide mounting portions 11A, 11B and standing portions 14A, 14B. As shown in FIG. 9, the mounting portions 11A and 11B are strip portions extending in the direction y in parallel to each other. As will be understood from FIGS. 9 and 10, the position at which the lead 1A projects from the resin package 3 and the position at which the lead 1B projects from the resin package 3 differ from each other in the direction y. That is, the respective ends of the mounting portions 11A and 11B are oriented in opposite directions. The standing portions 14A and 14B extend in the direction z from the mounting portions 11A and 11B, respectively. In surface-mounting the light emitting device A3, the standing portions 14A and 14B serve to promote the formation of a solder fillet. In the illustrated example, each of the standing portions 14A and 14B includes a lower portion formed with a through-hole having a rectangular cross section.

Similarly to the first and the second embodiments, the LED chip 2 is the light source of the light emitting device A3. The LED chip 2 is bonded to the bottom surface of the bonding cup 10. The upper surface of the LED chip 2 is electrically connected to the lead 1B via a wire 4. The light emitted from the LED chip 2 in the direction x or y is reflected by the side surface of the bonding cup 10 to travel in the direction z.

The resin package 3 covers the LED chip 2 and part of each lead 1A, 1B and is made of a resin (e.g. epoxy resin or silicone resin) which transmits the light emitted from the LED chip 2. The resin package 3 is formed with a lens 3a. The lens 3a is positioned to face the LED chip 2 and has an optical axis L extending in the direction z.

The advantages of the light emitting device A3 will be described below.

Figure 11:
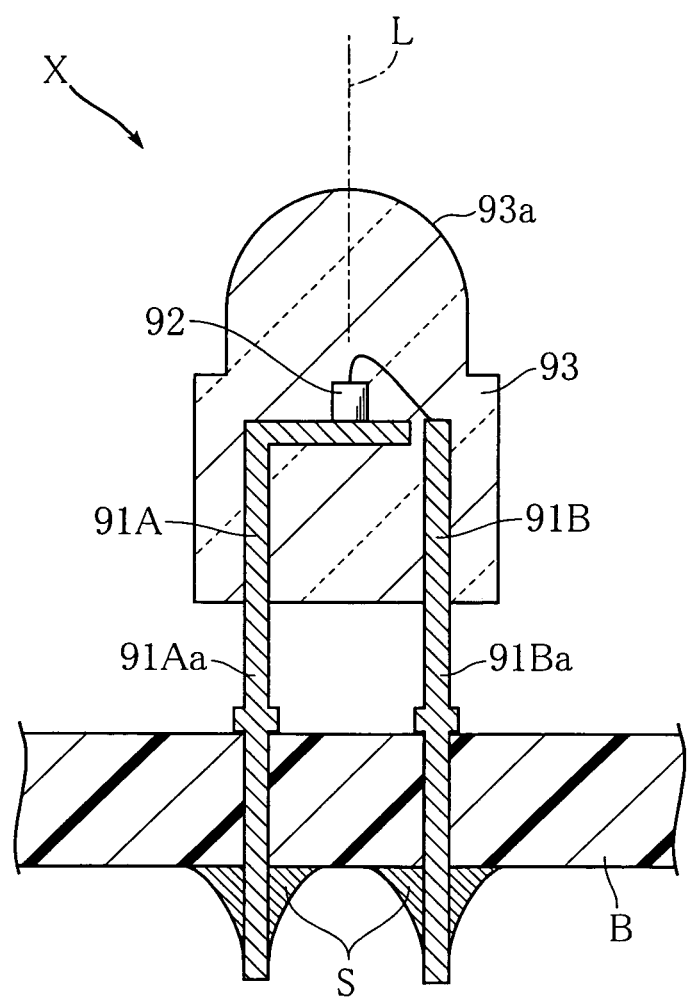
FIG. 11 is a sectional view showing an example of conventional semiconductor light emitting device.

With the above-described structure, the light emitting device A3 can be surface-mounted on a circuit board by using the mounting portions 11A and 11B. Unlike the conventional light emitting device X shown in FIG. 11, the two leads 1A and 1B are not easily bent even when external force is applied from any of the directions X and y. Thus, the light emitting device A3 is stably mounted to e.g. a circuit board. Further, since a good solder fillet is formed due to the standing portions 14A and 14B, the light emitting device A3 is strongly bonded. Moreover, in mounting the light emitting device by soldering, the centering effect due to molten solder is exerted at the connecting portions 15A, 15B (see FIG. 9) connecting the standing portions 14A, 14B to the mounting portions 11A, 11B.

The invention claimed is:

1. A semiconductor light emitting device comprising:
   a semiconductor light emitting element;
   a lead electrically connected to the semiconductor light emitting element; and
   a resin package covering the semiconductor light emitting element and no more than part of the lead, the resin package including a lens facing a front of the semiconductor light emitting element;
   wherein the lead includes an elongated surface-mounting portion projecting from the resin package, the surface-mounting portion including a pair of first projections spaced from each other in a longitudinal direction thereof and a second projection positioned in the longitudinal direction between the first projections, the first projections and the second projection projecting in opposite directions from each other in a width direction of the surface-mounting portion.

2. The semiconductor light emitting device according to claim 1, wherein the surface-mounting portion extends in either one of a first direction parallel to an optical axis of the lens and a second direction perpendicular to the first direction, and wherein the lead includes an additional surface-mounting portion extending in the other one of the first direction and the second direction.

3. The semiconductor light emitting device according to claim 1, wherein the surface-mounting portion extends in an optical axis direction of the lens.

4. The semiconductor light emitting device according to claim 1,
   wherein said semiconductor light emitting device, comprises said lead as a first lead, and further comprises a second lead connected to the semiconductor light emitting element and no more than partially covered by the resin package, and
   wherein the second lead includes a surface-mounting portion spaced apart from and extending in parallel to the surface-mounting portion of the first lead, and the surface-mounting portion of the second lead includes a pair of first projections spaced from each other in the longitudinal direction and a second projection positioned in the longitudinal direction between the first projections of the second lead.

5. The semiconductor light emitting device according to claim 4, wherein the first projections of the first lead and the second projections of the second lead extend in a mutually facing direction, and the second projection of the first lead and the second projection extend in a mutually opposite direction.

6. The semiconductor light emitting device according to claim 4, wherein the surface-mounting portion of each of the first lead and the second lead includes, at a position adjacent to the second projection, an additional second projection.

7. The semiconductor light emitting device according to claim 4, wherein the surface-mounting portion of each of the first lead and the second lead includes a third projection extending oppositely to one of the first projections, and the third projection and said one of the first projections are disposed at a same position of the surface-mounting portion in the longitudinal direction.

\* \* \* \* \*